United States Patent
Chu et al.

(10) Patent No.: US 7,022,592 B2
(45) Date of Patent: Apr. 4, 2006

(54) AMMONIA-TREATED POLYSILICON SEMICONDUCTOR DEVICE

(75) Inventors: Wen-Ting Chu, Kaohsiung (TW); Yeur-Luen Tu, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 13 days.

(21) Appl. No.: 10/678,783

(22) Filed: Oct. 3, 2003

(65) Prior Publication Data
US 2005/0073015 A1    Apr. 7, 2005

(51) Int. Cl.
*H01L 27/108* (2006.01)

(52) U.S. Cl. ...................................... 438/488; 438/494

(58) Field of Classification Search ............... 438/FOR 363–FOR 385, 201, 211, 238, 239; 257/296–310
See application file for complete search history.

(56) References Cited

U.S. PATENT DOCUMENTS

| | | | |
|---|---|---|---|
| 4,452,881 A * | 6/1984 | Augstein et al. ............ 430/323 |
| 5,192,703 A * | 3/1993 | Lee et al. | |
| 6,297,123 B1 * | 10/2001 | Sze et al. | |
| 6,362,045 B1 * | 3/2002 | Lin et al. ..................... 438/257 |
| 6,380,583 B1 * | 4/2002 | Hsieh et al. ................. 257/314 |
| 6,566,734 B1 * | 5/2003 | Sugihara et al. | |

* cited by examiner

*Primary Examiner*—Fetsum Abraham
(74) *Attorney, Agent, or Firm*—Slater & Matsil, L.L.P.

(57) ABSTRACT

Semiconductor devices, and methods of fabricating, having ammonia-treated polysilicon devices are provided. A substrate is provided upon which a polysilicon layer is formed. The polysilicon layer is treated with ammonia. Thereafter, portions of the polysilicon layer may be oxidized, forming poly-oxide regions. The poly-oxide regions may be used, for example, to form the poly-oxide layer of a split-gate transistor. The ammonia treatment reduces the tendency of the polysilicon to oxidize along the grain boundaries, thereby allowing smaller designs to be fabricated without bridging occurring between polysilicon structures.

14 Claims, 3 Drawing Sheets

AMMONIA-TREATED POLYSILICON SEMICONDUCTOR DEVICE

TECHNICAL FIELD

The present invention relates to the field of semiconductor devices, and more specifically, to semiconductor devices having a split-gate transistor.

BACKGROUND

Complementary metal-oxide-semiconductor (CMOS) technology is the dominant semiconductor technology used for the manufacture of ultra-large scale integrated (ULSI) circuits today. Size reduction of the semiconductor structures has provided significant improvement in the speed, performance, circuit density, and cost per unit function of semiconductor chips over the past few decades. Significant challenges are faced as the sizes of CMOS devices continue to decrease.

One such problem is seen in devices that utilize poly-oxide structures. For example, split-gate transistors, which are commonly used in memory devices, are generally formed by depositing a polysilicon layer on a wafer. A masking material, such as silicon nitride ($Si_3N_4$), is formed and patterned on the polysilicon wafer to define areas that are to become a poly-oxide and a floating gate of the split-gate transistor. The exposed portions of the polysilicon are oxidized, and the masking material is removed. The poly-oxide regions act as a mask during an etching process to remove the unwanted polysilicon. The split-gate transistor is completed by forming an inter-poly oxide layer and a control gate.

During oxidation, however, the polysilicon has a tendency to oxidize along the grain boundaries of the polysilicon. In smaller designs, particularly in designs in which sharp, straight edges are desired, the oxidation along grain boundaries results in irregular etching patterns of the unwanted polysilicon. In some cases, the oxidation along grain boundaries can cause the polysilicon to bridge between elements, thereby rendering the devices inoperative. This phenomena is increasingly troublesome as device sizes decrease.

Therefore, there is a need for semiconductor devices having poly-oxide structures with a reduced amount of oxidation along grain boundaries.

SUMMARY OF THE INVENTION

These and other problems are generally reduced, solved or circumvented, and technical advantages are generally achieved, by embodiments of the present invention which provides a semiconductor device having a polysilicon layer treated with ammonia.

In one embodiment of the present invention, a method of forming a polysilicon structure is provided. A polysilicon layer is formed on a substrate and treated with ammonia. The polysilicon layer may then be oxidized. The ammonia treatment reduces the amount of oxidation that occurs along the grain boundaries of the polysilicon layer.

A masking layer may be applied to the polysilicon layer prior to oxidation, thereby limiting the portions of the polysilicon layer that becomes oxidized. In one embodiment, the masking layer is a layer of silicon nitride that has been patterned.

In another embodiment, an apparatus comprising a polysilicon layer treated with ammonia and a poly-oxide layer formed on the polysilicon layer.

In yet another embodiment, a split-gate transistor is provided wherein the floating gate is a polysilicon layer that has been treated with ammonia. The polysilicon layer is then oxidized to form the poly-oxide layer of the split-gate transistor.

In yet another embodiment, a polysilicon layer treated with ammonia is provided, such that the polysilicon layer may be used to fabricate semiconductor devices. The polysilicon layer treated with ammonia may be used to create a split-gate transistor and memory devices.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1A:
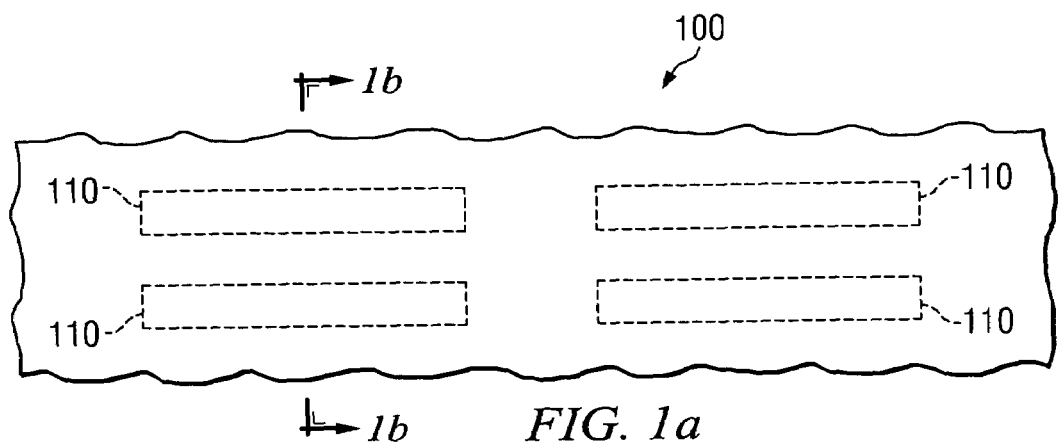
FIGS. 1a, 2a, 3a, 4a, and 5a are plan views of various process steps of fabricating a memory array in accordance with an embodiment of the present invention.

The making and using of the presently preferred embodiments are discussed in detail below. It should be appreciated, however, that embodiments of the present invention provide many applicable inventive concepts that can be embodied in a wide variety of specific contexts. The specific embodiments discussed are merely illustrative of specific ways to make and use the invention, and do not limit the scope of the invention.

For example, one embodiment of the present invention is a memory device having a split-gate transistor, such as a flash electrically erasable and programmable read-only memory (flash EEPROM). Accordingly, the discussions that follow describe a process of fabricating semiconductor structures having a split-gate transistor that may be used to fabricate a flash EEPROM. Embodiments of the present invention, however, may be used for forming semiconductor structures other than split-gate transistors.

FIGS. 1–5 illustrate plan views and cross-section views of a wafer during various steps of one embodiment of the present invention in which an ammonia treatment is performed on a polysilicon layer. Referring first to FIGS. 1a–1b, FIG. 1a is a plan view and FIG. 1b is a cross-section view of a wafer 100 after shallow trench isolations (STIs) 110, an oxide layer 112, and a polysilicon layer 114 have been formed. The STIs 110 are preferably formed by photolithography techniques as is known in the art and are filled with a dielectric material such as an oxide material, a high-density plasma (HDP) oxide, or the like, formed by conventional methods. The resulting wafer is planarized, preferably by a chemical-mechanical polishing (CMP) using an oxide slurry.

The oxide layer 112 may be formed by, for example, an oxidation process. The oxidation step may be, for example, a wet or dry oxidation process such as wet or dry thermal oxidation in an ambient comprising an oxide, $H_2O$, NO, or a combination thereof, or by chemical vapor deposition (CVD) techniques using tetra-ethyl-ortho-silicate (TEOS) and oxygen as a precursor. Preferably, the oxide layer 112 is formed by a wet thermal oxidation process and is about 70 Å to about 150 Å in thickness.

The polysilicon layer 114 is formed on the wafer 100 and will be patterned in subsequent processing steps. The polysilicon layer 114 is generally a semiconductor material such as polysilicon, amorphous silicon, or the like. The polysilicon layer 114 may be deposited doped (e.g., furnace deposition of an in-situ doped polysilicon) or un-doped. If the polysilicon layer 114 is deposited undoped, the polysilicon layer 114 may be doped after the polysilicon layer 114 is formed. The polysilicon layer 114 may be doped with an N-type ion implant process or a P-type ion implant process for fabricating NMOS or PMOS devices, respectively.

The polysilicon layer 114 is subjected to an ammonia ($NH_3$) treatment. It should be noted that the ammonia treatment may be performed before or after doping of the polysilicon layer 114. The ammonia treatment may be performed by, for example, a thermal anneal (e.g., thermal anneal or a rapid thermal anneal (RTA)) in an ammonia ambient. Preferably, the ammonia treatment is performed by a thermal anneal process at a temperature of approximately 700° to 1000° C. for about 5 minutes to about 300 minutes. More preferably, however, the thermal anneal is performed at a temperature of about 800° C. for about 30 minutes.

Figure 1B:
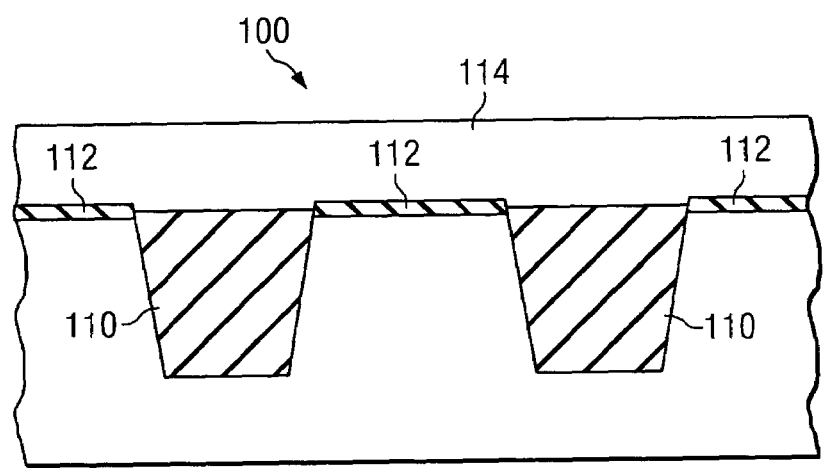
FIGS. 1b, 2b, 3b, 4b, and 5b are cross-section views corresponding to the plan views illustrated in FIGS. 1a, 2a, 3a, 4a, and 5a, respectively of various process steps of fabricating a memory array in accordance with an embodiment of the present invention.
Figure 2A:
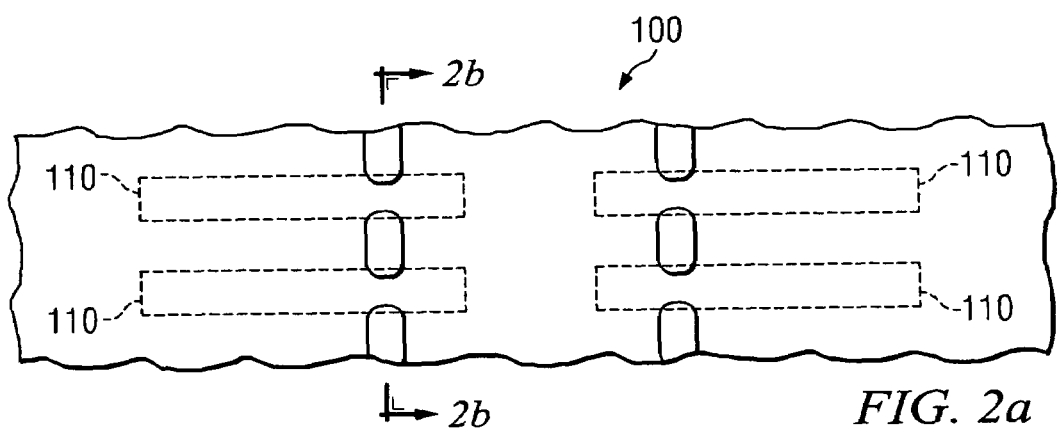
Figure 2B:
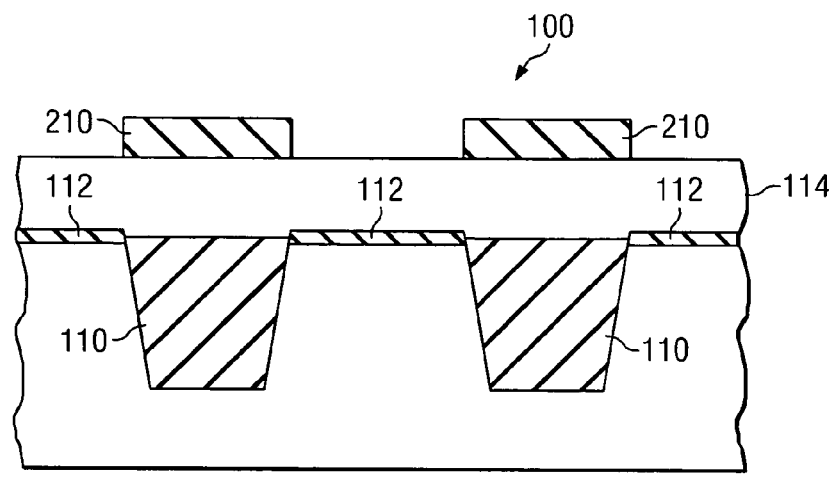

Referring to FIGS. 2a–2b, FIG. 2a is a plan view and FIG. 2b is a cross-section view of the wafer 100 of FIGS. 1a–1b after a hard mask 210 has been formed and patterned to define the shape of a floating gate of a split-gate transistor. The hard mask 210 is a protective layer to prevent the underlying structures from being removed during an etching process performed in later steps. One such suitable hard mask 210 is a silicon nitride ($Si_3N_4$) layer. The $Si_3N_4$ layer may be formed, for example, using CVD techniques with silane and ammonia as precursor gases, and deposition temperatures ranging from 600° to 900° C. The hard mask 210 is preferably about 400 Å to about 4000 Å in thickness, but more preferably about 1000 Å in thickness. The hard mask 210 may be formed of other mask materials, such as a nitrogen containing layer other than $Si_3N_4$. For example, the hard mask 210 could comprise silicon nitride $Si_xN_y$, silicon oxynitride $SiO_xN_y$, or a combination thereof.

The hard mask 210 is preferably patterned by applying, exposing, and developing a photoresist mask (not shown). After the photoresist mask has been patterned, an etching step is performed to remove unwanted portions of the hard mask 210. In the preferred embodiment in which the hard mask 210 comprises $Si_3N_4$, one commonly used method of etching the hard mask 210 is dry etch process such as, for example, a reactive ion etch (RIE).

In an alternative embodiment, the ammonia treatment may be performed after the hard mask 210 has been formed and patterned, prior to performing the following oxidation step.

Figure 3A:
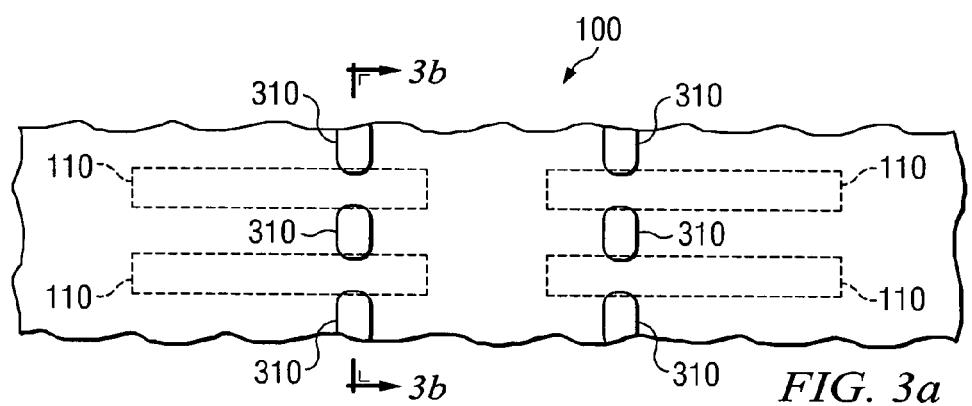
Figure 3B:
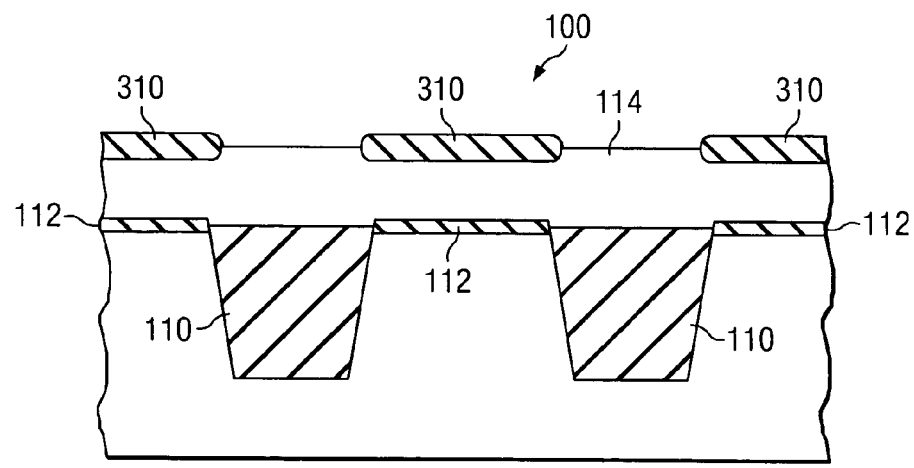

Referring to FIGS. 3a–3b, FIG. 3a is a plan view and FIG. 3b is a cross-section view of the wafer 100 of FIGS. 2a–2b after exposed portions of the polysilicon layer 114 have been oxidized and the hard mask 210 has been removed. The oxidation of the exposed portions of the polysilicon layer 114 forms poly-oxide regions 310, which becomes a poly-oxide layer of a split-gate transistor in later steps. The poly-oxide regions 310 may be formed by oxidizing the exposed portions of the polysilicon layer 114. The hard mask 210 acts as an oxidation mask, preventing the polysilicon beneath the hard mask 210 from becoming oxidized. The oxidation may be performed, for example, by a wet or dry oxidation process. Preferably, however, a wet oxidation process at a temperature of about 800° C. to about 1100° C. is used. The poly-oxide regions 310 are preferably about 500 Å to about 3000 Å in thickness.

It should be noted that polysilicon treated with ammonia decreases the tendency of the polysilicon to oxidize along the grain boundary. By restricting the amount of oxidation along the grain boundary, the polysilicon bridging is reduced when etching the polysilicon layer 114.

It should be noted that the poly-oxide regions 310 act as a mask during the removal of the hard mask 210, protecting the underlying polysilicon from removal. In the preferred embodiment in which the hard mask 210 comprises $Si_3N_4$, the hard mask 210 may be removed, for example, in a wet dip in dilute hydrofluoric acid. Another commonly used wafer cleaning solution is a mixture of concentrated sulphuric acid and hydrogen peroxide, commonly referred to as piranha solution. A phosphoric acid solution of phosphoric acid ($H_3PO_4$) and water ($H_2O$) may also be used to remove the hard mask 210.

Figure 4A:
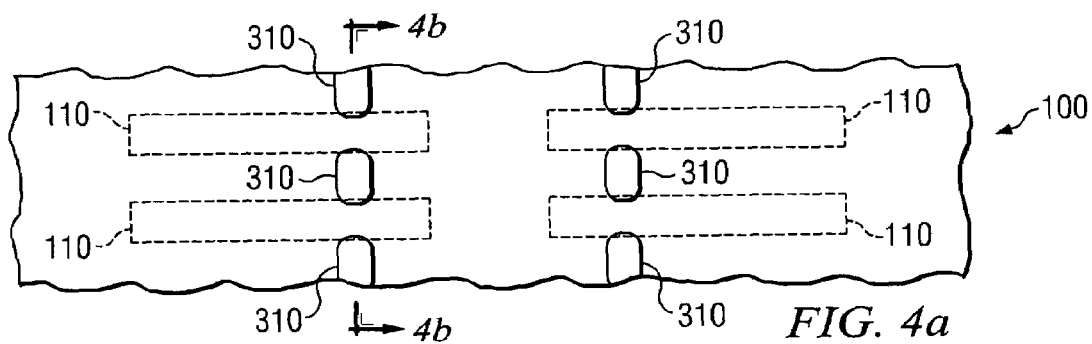
Figure 4B:
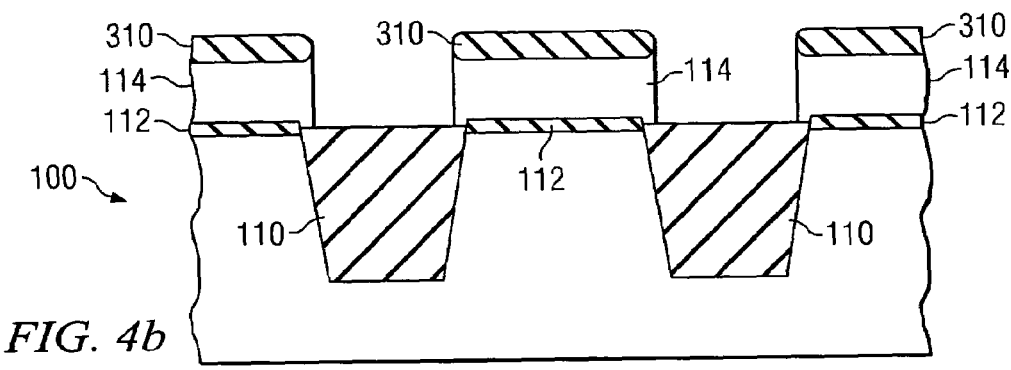

Referring to FIGS. 4a–4b, FIG. 4a is a plan view and FIG. 4b is a cross-section view of the wafer 100 of FIGS. 3a–3b after unwanted portions of the polysilicon layer 114 have been removed. The polysilicon layer 114 is preferably removed via a dry etch process, such as, for example, an RIE process. As discussed above, the poly-oxide regions 310 act as a mask during the etching process to remove the unwanted portions of the polysilicon layer 114. In this manner, portions of the polysilicon layer 114 that are to become the floating gate of a split-gate transistor are protected during the etching process.

Figure 5A:
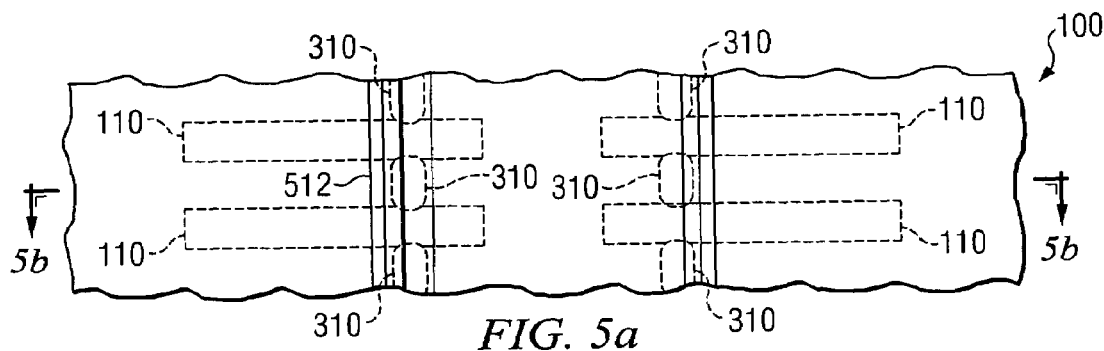
Figure 5B:
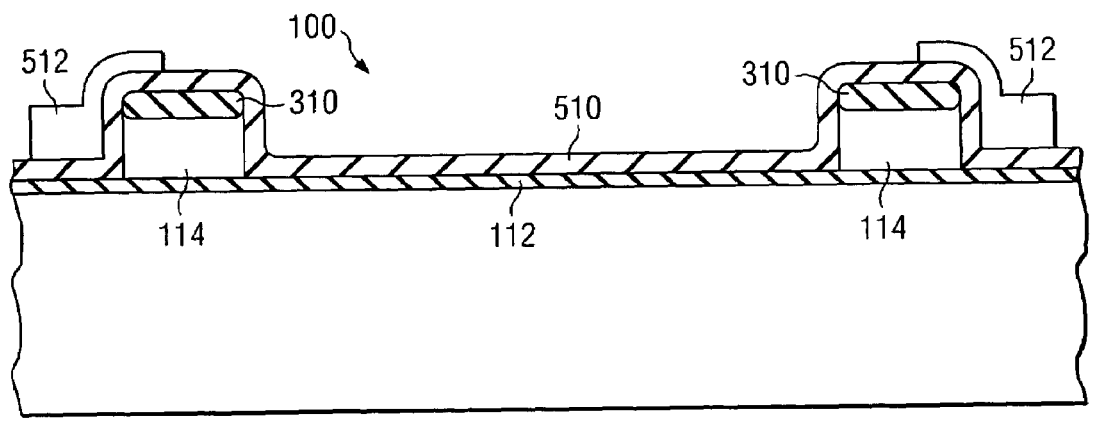

Thereafter, standard processes may be used to complete fabrication of the semiconductor device. For example, FIG. 5a is a plan view and FIG. 5b is a cross-section view of the wafer 100 of FIGS. 4a–4b after an inter-poly oxide 510 and a control gate 512 have been formed in accordance with known processes. Other steps may include forming silicide contact areas, source polysilicon plugs, an inter-layer dielectric, word lines, bit lines, ion implantation, and the like.

Although particular embodiments of the invention have been described in detail, it is understood that the invention is not limited correspondingly in scope, but includes all changes, modifications, and equivalents coming within the spirit and terms of the claims appended hereto. For example, different materials may be used for substrates, masks, and other structures, different structures may be fabricated, and the like. Accordingly, it is understood that this invention may be extended to other structures and materials, and thus, the specification and figures are to be regarded in an illustrative rather than a restrictive sense.

What is claimed is:

1. A method of forming a semiconductor structure, the method comprising:
   providing a substrate;
   forming a polysilicon layer on the substrate;
   treating the polysilicon layer with ammonia;
   forming and patterning a first mask on the polysilicon layer;
   oxidizing exposed portions of the polysilicon layer, thereby forming oxidized portions of the polysilicon layer;
   removing the first mask; and
   removing portions of the polysilicon layer, wherein the oxidized portions of the polysilicon layer act as a mask.

2. The method of claim 1, wherein the substrate has one or more shallow trench isolations formed therein and an oxide layer formed on the substrate.

3. The method of claim 1, wherein the polysilicon layer is formed by low-pressure chemical vapor deposition.

4. The method of claim 1, wherein the polysilicon layer is about 500 Å to about 3000 Å in thickness.

5. The method of claim 1, wherein the step of oxidizing is performed by wet thermal oxidation.

6. The method of claim 1, wherein the semiconductor structure is a split-gate transistor.

7. The method of claim 1, wherein the first mask comprises a layer of silicon nitride.

8. The method of claim 7, wherein the layer of silicon nitride is about 400 Å to about 4000 Å in thickness.

9. The method of claim 1, wherein the treating the polysilicon with ammonia includes performing a thermal anneal in an ammonia ambient.

10. A method of forming a split-gate transistor, the method comprising:
   providing a substrate;
   forming a first polysilicon layer on the substrate;
   treating a surface of the first polysilicon layer with ammonia;
   forming and patterning a first mask on the first polysilicon layer, thereby exposing portions of the first polysilicon layer;
   oxidizing exposed portions of the first polysilicon layer, thereby forming oxidized portions of the first polysilicon layer;
   removing the first mask;
   removing portions of the first polysilicon layer, wherein the oxidized portions of the first polysilicon layer act as a mask, the remaining portion of the first polysilicon layer forming a floating gate;
   forming a dielectric layer over the floating gate, the dielectric layer forming an inter-poly oxide of the split-gate transistor; and
   forming a second polysilicon layer over the dielectric layer to form a control gate of the split-gate transistor.

11. The method of claim 9, wherein the treating a surface of the first polysilicon layer with ammonia includes performing a thermal anneal in an ammonia ambient.

12. The method of claim 9, wherein the first polysilicon layer is about 500 Å to about 3000 Å in thickness.

13. The method of claim 9, wherein the step of oxidizing is performed by wet thermal oxidation.

14. The method of claim 9, wherein the step of patterning a first mask includes removing at least a portion of the first polysilicon layer treated with ammonia.

* * * * *